(12) United States Patent
Hosoda et al.

(10) Patent No.: US 7,819,717 B2
(45) Date of Patent: Oct. 26, 2010

(54) EMISSIVE DEVICE, PROCESS FOR PRODUCING EMISSIVE DEVICE, AND ELECTRONIC APPARATUS

(75) Inventors: Toshiko Hosoda, Chino (JP); Shinichi Yotsuya, Chino (JP)

(73) Assignee: Seiko Epson Corporation, Tokyo (JP)

( * ) Notice: Subject to any disclaimer, the term of this patent is extended or adjusted under 35 U.S.C. 154(b) by 325 days.

(21) Appl. No.: 11/672,389

(22) Filed: Feb. 7, 2007

(65) Prior Publication Data
US 2007/0222367 A1  Sep. 27, 2007

(30) Foreign Application Priority Data
Mar. 27, 2006  (JP) .............................. 2006-086744

(51) Int. Cl.
*H01J 9/24* (2006.01)
(52) U.S. Cl. ............................. 445/24; 427/69; 313/506
(58) Field of Classification Search .................. 427/69, 427/40; 313/506; 445/24
See application file for complete search history.

(56) References Cited

U.S. PATENT DOCUMENTS 6,872,472 B2 * 3/2005 Liao et al. ................... 428/690
7,304,700 B2 * 12/2007 Park et al. ................... 349/106
2006/0238118 A1 * 10/2006 Spindler ...................... 313/506
2006/0238119 A1 * 10/2006 Spindler ...................... 313/506
2007/0046195 A1 * 3/2007 Chin et al. ................... 313/506
2007/0200495 A1  8/2007 Kai et al.

FOREIGN PATENT DOCUMENTS

| JP | A 8-227276 | 9/1996 |
|---|---|---|
| JP | A-10-3990 | 1/1998 |
| JP | A 2000-91082 | 3/2000 |
| JP | A-2007-234268 | 9/2007 |

* cited by examiner

*Primary Examiner*—Joseph L Williams
*Assistant Examiner*—Andrew J Coughlin
(74) *Attorney, Agent, or Firm*—Oliff & Berridge, PLC

(57) ABSTRACT

A process for producing an emissive device that includes (1) feeding the first material to the first region and the third region and to a side adjacent to a first face of at least one first electrode by a gas-phase process with a first mask to form films; (2) feeding the second material to the second region and the third region such that the second material fed in the third region is stacked above the first material in the third region and to the side adjacent to the first face of each first electrode by a gas-phase process to form the emissive layers; and (3) forming a second electrode at a side of each emissive layer opposite the side adjacent to the first electrode.

9 Claims, 8 Drawing Sheets

EMISSIVE DEVICE, PROCESS FOR PRODUCING EMISSIVE DEVICE, AND ELECTRONIC APPARATUS

BACKGROUND

1. Technical Field

The present invention relates to a process for producing an emissive device and also relates to an emissive device and an electronic apparatus.

2. Related Art

Organic electroluminescent (EL) elements each including an emissive organic layer (organic electroluminescent layer) disposed between a cathode and an anode can achieve significantly low applied voltages compared with inorganic electroluminescent elements. Furthermore, organic EL elements that display various colors can be produced.

Specifically, organic EL elements each include an anode, a cathode, and an organic EL layer disposed between the anode and the cathode.

In general, organic EL layers are each composed of three layers, i.e., a hole transport layer, an emissive layer, an electron transport layer, and, optionally, other layers.

In organic EL elements, various methods, such as an RGB separate deposition method, a color filter method, and a color conversion method, are known as a method for displaying colors.

An organic EL element according to the RGB separate deposition method includes emissive layers that display three colors, red (R), green (G), and blue (B), the emissive layers being disposed separately from each other in a single pixel. Independent control of the emission of each emissive layer results full-color emission.

Such R-, G-, and B-emissive layers are generally formed by vacuum evaporation with emissive materials. For example, Japanese Unexamined Patent Application Publication Nos. 2000-91082 and 8-227276 each disclose a method for forming emissive layers through three evaporation steps with three types of masks in such a manner that each emissive layer is deposited on a predetermined region by vacuum evaporation.

In recent years, there have been advances in the development of full-color organic EL elements according to an RGBW separate deposition method in order to suppress the degradation of the emissive layers.

Organic EL elements according to the method for displaying colors each include emissive layers that display four colors, R, G, B, and white (W), in a single pixel. Among the emissive layers displaying four colors, the emissive layer displaying W is formed by overlapping at least two emissive layers of the emissive layers displaying R, G, and B.

Such an organic EL element may be formed by a method, similar to the above-described method, of forming emissive layers displaying R, G, and B, preparing a mask for forming an emissive layer displaying W, successively depositing at least two emissive layers of the emissive layers displaying R, G, and B with the mask to form the emissive layer displaying W.

In the method, at least four types of masks and at least five evaporation steps are required to form the emissive layers displaying the four colors. However, in view of economics, it is intended to minimize the number of the masks used because the masks are significantly expensive.

The evaporation steps are performed in reduced pressure for a prolonged period of time, thus prolonging the production process of the organic EL element.

SUMMARY

Advantages of some aspects of the invention is that an efficient process for producing an emissive device at low cost is provided, and a high-reliability emissive device produced by the production process is provided, and an electronic apparatus is provided.

The invention having the advantages are described below.

A process according to an aspect of the invention for producing an emissive device having a first emissive layer composed of a first material that emits light of a first color, a second emissive layer composed of a second material that emits light of a second color different from the first colors and a third emissive layer that emits light of a third color by stacking at least the first material and the second material, the third color being different from both of the first color and the second color, the process includes:

(1) feeding the first material to a side adjacent to a first face of at least one first electrode by a gas-phase process with a first mask to form films, the first mask having an opening for forming the first emissive layer and having an opening for forming the third emissive layer;

(2) feeding the second material to the side adjacent to the first face of each first electrode by a gas-phase process to form the emissive layers while a second mask having an opening for forming the second emissive layer and having an opening for forming the third emissive layer is positioned in such a manner that the position of each film to be the third emissive layer is substantially identical to the position of the opening for forming the third emissive layer; and (3) forming a second electrode at a side of each emissive layer opposite the side adjacent to the first electrode.

Thus, the emissive device can be efficiently produced at low cost.

In the process according to an aspect of the invention for producing the emissive device, one of the first color and the second color is preferably blue. The other is preferably red. The third color is prefer ably white.

Thus, in particular, an emissive layer emitting white light can be formed through a small number of evaporation steps (at least two steps).

In the process according to an aspect of the invention for producing the emissive device, the emissive device further has a fourth emissive layer composed of a material that emits light of a fourth color different from the first color, the second color, and the third color, and, preferably, the process further includes:

(4) feeding the material that emits light of the fourth color to the side adjacent to the first face of each first electrode by a gas-phase process with a third mask having an opening for forming the fourth emissive layer.

Thus, four types of emissive layers can be efficiently formed through a small number of evaporation steps with a small number of masks.

In the process according to an aspect of the invention for producing the emissive device, the emissive device has the third emissive layer that emits light of the third color by stacking the first material, the second material, and the material that emits light of the fourth color, and the process preferably includes:

the step (4) being performed between the step (1) and the step (2), wherein the step (4) includes feeding the material that emits light of the fourth color to the side adjacent to the first face of the at least one first electrode by a gas-phase process while the third mask having the opening for forming the fourth emissive layer and further having an opening for forming the third emissive layer is positioned in such a manner that the position of each film to be the third emissive layer is substantially identical to the position of the opening for forming the third emissive layer.

Thus, four types of emissive layers can be efficiently formed through a small number of evaporation steps with a small number of masks.

In the process according to an aspect of the invention for producing an emissive device, the fourth color is preferably green.

Thus, a full-color emissive device can be efficiently produced when the first color is blue and when the second color is red.

In the process according to an aspect of the invention for producing an emissive device, preferably, the emissive device has a structure in which light emerges from the first electrode side,
wherein the first color is blue, and the second color is red.
Thus, light emission with high color purity is achieved.

In the process according to an aspect of the invention for producing an emissive device, preferably, each of the first electrodes is disposed in a corresponding one of the emissive layers, and
the process further comprises forming banks for partitioning each first electrode before the step (1).

Thus, mixing of evaporation materials is prevented to permit each emissive layer to emit light at the level of the intrinsic light-emitting performance of the corresponding material.

In the process according to an aspect of the invention for producing an emissive device, the gas-phase process is preferably an evaporation process.

Thus, the emissive layers can be formed while maintaining molecular structures of materials constituting the emissive layers. As a result, the materials can offer the intrinsic emission performance. Furthermore, the emissive layers having satisfactory properties can be formed.

An emissive device according to an aspect of the invention is produced by the process according to an aspect of the invention for producing the emissive device.

Thus, the high-reliability emissive device is obtained at low cost.

An electronic apparatus according to an aspect of the invention includes the emissive device according to an aspect of the invention.

Thus, the high-reliability emissive device is obtained at low cost.

BRIEF DESCRIPTION OF THE DRAWINGS

The invention will be described with reference to the accompanying drawings, wherein like numbers reference like elements.

DESCRIPTION OF EXEMPLARY EMBODIMENTS

Preferred embodiments of an inventive emissive device, an inventive process for producing the emissive device, and an inventive electronic apparatus shown in accompanying drawings will be described below.

First Embodiment

First, a first embodiment of an active-matrix display including an emissive device according to an aspect of the invention and a first embodiment of a process for producing the active-matrix display (an inventive process for producing an emissive device) will be described.

Active-Matrix Display

Figure 1:
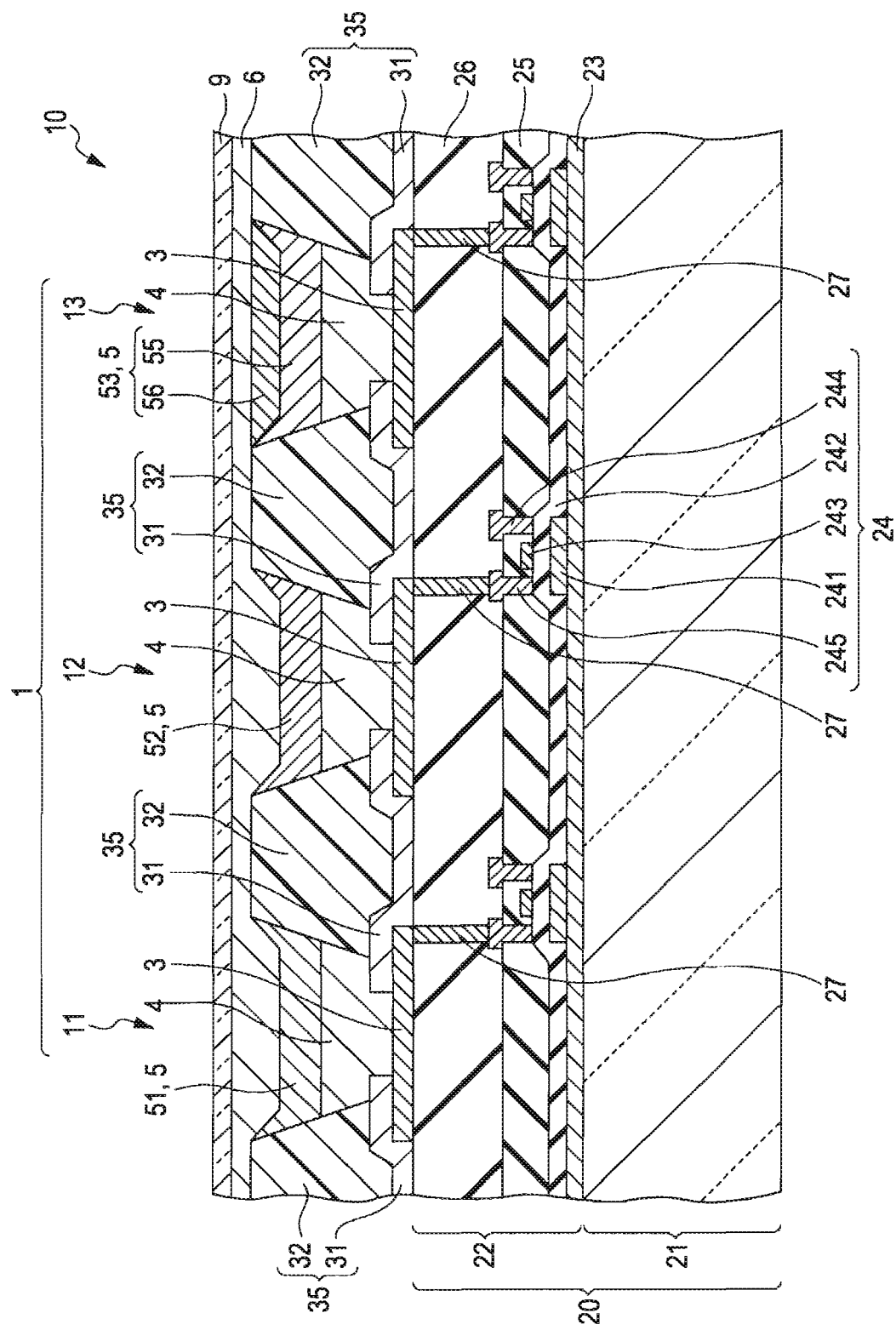
FIG. 1 is a longitudinal sectional view of an active-matrix display according to a first embodiment including an emissive device according to an aspect of the invention.

FIG. 1 is a longitudinal sectional view of an active-matrix display according to a first embodiment including an emissive device according to an aspect of the invention. FIGS. 2A to 4K each illustrate a process for producing the active-matrix display shown in FIG. 1. In the following description, the upper side of each of FIGS. 1 to 4K refers to an "upper side", and the lower side each of FIGS. 1 to 4K refers to a "lower side".

An active-matrix display (hereinafter, simply referred to as a "display") 10 shown in FIG. 1 includes a TFT circuit board (opposite board) 20, three types of organic EL elements 11, 12, and 13 disposed on the TFT circuit board 20, and a top substrate 9 opposite the TFT circuit board 20.

In the three types of the organic EL elements 11, 12, and 13, the plurality of the organic EL elements 11, the plurality of the organic EL elements 12, and the plurality of the organic EL elements 13 are included in the display 10. Among these organic EL elements, three adjacent organic EL elements 11, 12, and 13 constitute a single pixel 1. The display 10 includes many pixels 1.

The three organic EL elements 11, 12, and 13 emit different colors from each other. The emission colors are not particularly limited. In this embodiment, each of the first organic EL elements 11 emits blue (first color) light, each of the second organic EL elements 12 emits red (second color) light, and each of the third organic EL elements 13 emits white (third color) light. According to this structure, emissive layers emitting white light can be formed through evaporation steps described below, in particular, through a small number of the evaporation steps (at least two times). The adjustment of emission intensity of the three organic EL elements 11, 12, and 13 permits each pixel 1 to emit a color among blue, red, and white.

The control of emission intensity of each pixel 1 permits the display 10 to display a predetermined information set, such as letter, numeral, symbol, or figure, and a predetermined design.

The TFT circuit board 20 includes a substrate 21 and a circuit portion 22.

The substrate 21 serves as a support for portions constituting the display 10. The top substrate 9 serves as a protective film or the like for the organic EL elements 11, 12, and 13 and the like.

The display 10 has a structure in which light emerges from the substrate 21 side, i.e., the display 10 is of a bottom emission type. Thus, the substrate 21 is substantially transparent (transparent and colorless, transparent and colored, or translucent). The top substrate 9 not particularly required to have transparency.

Among various substrates composed of glass or resins, a substrate having a relatively high hardness may be suitably used as the substrate 21.

Among various substrates composed of glass or resins, a transparent substrate may be used as the top substrate 9. For example, the top substrate 9 may be a substrate mainly composed of a glass material, such as quartz glass or soda glass; or a resin material, such as a polyethylene terephthalate, a polyethylene naphthalene, a polypropylene, a cycloolefin polymer, a polyamide, a polyether sulfone, a polymethyl methacrylate, a polycarbonate, or a polyallylate.

The average thickness of the substrate 21 is not limited but is preferably about 1 to about 30 mm and more preferably about 5 to about 20 mm. The average thickness of the top substrate 9 is also not limited but is preferably about 0.1 to about 30 mm and more preferably about 0.1 to about 10 mm.

The display 10 according to the embodiment is of a bottom emission type. Alternatively, the display 10 may nave a structure in which light emerges from the top substrate 9 side, i.e., the display 10 may be of a top emission type. In this case, the top substrate 9 is substantially transparent.

The circuit portion 22 includes an underlying protective layer 23 disposed on the substrate 21, driving TFTs (switching elements) 24 disposed on the underlying protective layer 23, a first insulating interlayer 25, and a second insulating interlayer 26.

The driving TFTs 24 each include a semiconductor layer 241, a gate insulating layer 242 disposed on the semiconductor layer 241, a gate electrode 243 disposed on the gate insulating layer 242, a source electrode 244, and a drain electrode 245.

Each of the organic EL elements 11, 12, and 13 corresponding to a corresponding one of the driving TFTs 24 is disposed on the circuit portion 22. Adjacent organic EL elements 11, 12, and 13 are partitioned with banks 35 each having a first bank portion 31 and a second bank portion 32.

In this embodiment, anodes 3 of the organic EL elements 11, 12, and 13 constitute pixel electrodes. Each of the anodes 3 is electrically connected to the drain electrode 245 of a corresponding one of the driving TFTs 24 with a corresponding one of leads 27. Hole transport layers 4 are each disposed in a corresponding one of the organic EL elements 11, 12, and 13. Emissive layers 5 are each disposed in a corresponding one of the organic EL elements 11, 12, and 13. A cathode 6 serves as a common electrode.

The organic EL elements 11, 12, and 13 will be described below.

As shown in FIG. 1, each of the organic EL elements 11, 12, and 13 includes a corresponding one of the anodes 3, the cathode 6, and an organic semiconductor layer group (laminate) having a corresponding one of the hole transport layers 4 and a corresponding one of the emissive layers 5, the organic semiconductor layer group being disposed between the anode 3 and the cathode 6, the hole transport layer 4 and the emissive layer 5 being stacked in that order from the anode 3.

The anodes 3 are electrodes for injecting holes to the hole transport layers 4.

The anodes 3 are each preferably composed of a light-transmitting material (anode material) having a large work function and satisfactory conductivity.

Examples of the anode material include oxides, such as indium tin oxide (ITO, a complex of indium oxide and zinc oxide), $SnO_2$, Sb-containing $SnO_2$, and Al-containing ZnO; and metals, such as Au, Pt, Ag, Cu, and alloys thereof. Among these, at least one material may be used as the anode material.

The average thickness of each anode 3 is not particularly limited but is preferably about 10 to about 200 nm and more preferably about 50 to about 150 mm. As a result, the anodes 3 have necessary and sufficient electrical conductivity and optical transparency. For example, when each of the organic EL elements 11, 12, and 13 is of a bottom emission type, the organic EL elements 11, 12, and 13 suitable for practical use are obtained.

Examples of the anode material further include conductive resin materials, such as polythiophenes and polypyrroles.

The cathode 6 is an electrode for injecting electrons to the emissive layers 5. The cathode 6 is preferably composed of a material having a small work function.

Examples of the material for the cathode 6 include metals, such as Li, Mg, Ca, Sr, La, Ce, Er, Eu, Sc, Y, Yb, Ag, Cu, Al, Cs, Rb, and alloys thereof. These may be used alone or in combination (for example, a laminate having a plurality of layers).

In particular, when an alloy is used as the material for the cathode 6, an alloy containing a stable metal element, such as Ag, Al, or Cu, specifically, an alloy, such as MgAg, AlLi, or CuLi, is preferably used. The use of such an alloy as the material for the cathode 6 improves the electron injection efficiency and stability of the cathode 6.

The average thickness of the cathode 6 is not particularly limited but is preferably about 100 to about 10,000 nm, and more preferably about 200 to about 500 nm.

The display 10 in this embodiment is of a bottom emission type. Thus, the cathode 6 is not particularly required to be optically transparent.

The hole transport layers 4 transport holes injected from the anodes 3 to the emissive layers 5.

Examples of the material for each hole transport layers 4 include polyarylamines, fluorene-arylamine copolymers, fluorene-bithiophene copolymers, poly(N-vinylcarbazole)s, polyvinylpyrenes, polyvinylanthracenes, polythiophenes, polyalkylthiophenes, polyhexylthiophenes, poly(p-phenylene vinylene)s, poly(ethynylene vinylene)s, pyrene formaldehyde resins, ethylcarbazole formaldehyde resins, and derivatives thereof. These may be used alone or in combination.

A mixture of the above-described compound and other compound may be used. An example of a mixture containing a polythiophene is a poly(3,4-ethylenedioxythiophene/styrenesulfonic acid) (PEDOT/PSS).

The average thickness of each hole transport layer 4 is not particularly limited but is preferably about 10 to about 150 mm and more preferably about 50 to about 10 nm.

A hole injection layer for improving hole injection efficiency from the anode 3 may be disposed between each anode 3 and the corresponding hole transport layer 4.

Examples of the material (hole injection material) for the hole injection layer include copper phthalocyanine and 4,4',4"-tris(N,N-phenyl-3-methylphenylamino)triphenylamine (m-MTDATA).

Each emissive layer (organic emissive layer) 5 is disposed on a side of the corresponding hole transport layer 4 opposite the side adjacent to the corresponding anode 3. When a voltage is applied between each anode 3 and the cathode 6, the emissive layers 5 are fed with electrons from the cathode 6 and holes from the hole transport layers 4. Electrons are recombined with holes in the emissive layers 5. Energy released in recombination forms excitons. When the excitons return to a ground state, energy, such as fluorescence or phosphorescence, is released (emitted).

Referring to FIG. 1, the first organic EL element 11 includes a first emissive layer 51. The second organic EL element 12 includes a second emissive layer 52. The third organic EL element 13 includes a third emissive layer 53.

The first emissive layer 51 is composed of a first material that emits blue (first color) light. The second emissive layer 52 is composed of a second material that emits red (second color) light.

The third emissive layer 53 is composed of the first material (material that emits the first color light) constituting the first emissive layer 51 and the second material (material that emits the second color light) constituting the second emissive layer 52, a sublayer of the first material and a sublayer of the second material being stacked.

The stacking order of these sublayers is not particularly limited. In the case of the bottom-emission-type display 10 in the embodiment, the optical path length of light emitted from the sublayer disposed at the upper side is different from that of light emitted from the sublayer disposed at the lower side, causing slight change in color of light, in some cases. Thus, when the third emissive layer 53 is formed, the stacking order is preferably determined in view of the change in color of light. Specifically, in the case of the bottom-emission-type display 10, the sublayer that emits light having a longer wavelength is preferably disposed at the upper side. Thereby, light emissions with high color purity is achieved.

Examples of the material constituting each emissive layer 5 thiadiazole compounds such as benzothiadiazole; benzene compounds, such as 1,3,5-tris[(3-phenyl-6-trifluoromethyl) quinoxalin-2-yl]benzene (TPQ1) and 1,3,5-tris[{3-(4-tert-butylphenyl)-6-trisfluoromethyl}quinoxalin-2-yl]benzene (TPQ2); metal phthalocyanine compounds and metal-free phthalocyanine compounds, such as phthalocyanine, copper phthalocyanine (CuPc), and iron phthalocyanine; and low-molecular-weight compounds, such as tris(8-hydroxyquinolinolate) aluminum ($Alq_3$) and tris(2-phenylpyridine)iridium ($Ir(ppy)_3$). These may be used alone or in combination.

The average thickness of each emissive layer 5 is not limited but is preferably about 10 to about 150 nm and more preferably about 50 to about 100 nm.

An electron transport layer that transports electrons injected from the cathode 6 to the corresponding emissive layer 5 may be disposed between the corresponding emissive layer 5 and the cathode 6. Furthermore, an electron injection layer for improving electron injection efficiency from the cathode 6 to the corresponding electron transport layer may be disposed between the corresponding electron transport layer and the cathode 6.

Examples of the material (electron transport material) constituting the electron transport layer include benzene compounds (starburst compounds), such as 1,3,5-tris [(3-phenyl-6-trifluoromethyl)quinoxalin-2-yl]benzene (TPQ1) and 1,3,5-tris [{3-(4-tert-butylphenyl)-6-trisfluoromethyl}quinoxalin-2-yl]benzene (TPQ2); naphthalene compounds such as naphthalene; phenanthrene compounds such as phenanthrene; chrysene compounds such as chrysene; perylene compounds such as perylene; anthracene compounds such as anthracene; pyrene compounds such as pyrene; acridine compounds such as acridine; stilbene compounds such as stilbene; thiophene compounds such as BBOT; butadiene compounds such as butadiene; coumarin compounds such as coumarin; quinoline compounds such as quinoline; bistyryl compounds such as bistyryl; pyrazine compounds, such as pyrazine and distyrylpyrazine; quinoxaline compounds such as quinoxaline; benzoquinone compounds, such as benzoquinone and 2,5-diphenyl-p-benzoquinone; naphthoquainone compounds such as naphthoquainone; anthraquinone compounds such as anthraquinone; oxadiazole compounds, such as oxadiazole, 2-(4-biphenylyl)-5-(4-tert-butylphenyl)-1,3,4-oxadiazole (PBD), BMD, BND, BDD, and BAPD; triazole compounds such as triazole and 3,4,5-triphenyl-1,2,4-triazole; oxazole compounds; anthrone compounds such as anthrone; fluorenone compounds, such as fluorenone and 1,3,8-trinitro-fluorenone (TNF); diphenoquinone compounds, such as diphenoquinone and MBDQ; stilbenequinone compounds, such as stilbenequinone and MBSQ; anthraquinodimethane compounds; thiopyran dioxide compounds; fluorenylidenemethane compounds; diphenyldicyanoethylene compounds; fluorene compounds such as fluorene; metal phthalocyanine compounds and metal-free phthalocyanine compounds, such as phthalocyanine, copper phthalocyanine (CuPc), and iron phthalocyanine; and metal complexes such as 8-hydroxyquinoline aluminum ($Alq_3$) and complexes containing ligands, e.g., benzoxazole and benzothiazole.

Examples of other material (electron transport material) constituting the electron transport layer include polymers, such as oxadiazole polymers, e.g., polyoxadiazoles, and triazole polymers, e.g., polytriazoles.

The average thickness of each electron transport layer is not limited but is preferably about 1 to about 100 nm and more preferably about 20 to about 50 nm.

Examples of the material (electron injection material) constituting each electron injection layer include 8-hydroxyquinoline, oxadiazole, and derivatives thereof, such as a metal chelate oxinoid compound containing 8-hydroxyquinoline. These may be used alone or in combination. For example, a laminate having a plurality of layers composed of these materials may be used. Furthermore, any of various inorganic insulating materials and inorganic semiconductor materials may be used.

Each electron injection layer mainly composed of an inorganic insulating material or an inorganic semiconductor material effectively prevents the occurrence of leakage current to improve electron injection properties and durability.

The display 10 is produced by a production process to which an inventive process for producing an emissive device is applied. The production process will be described below.

Figure 2A:
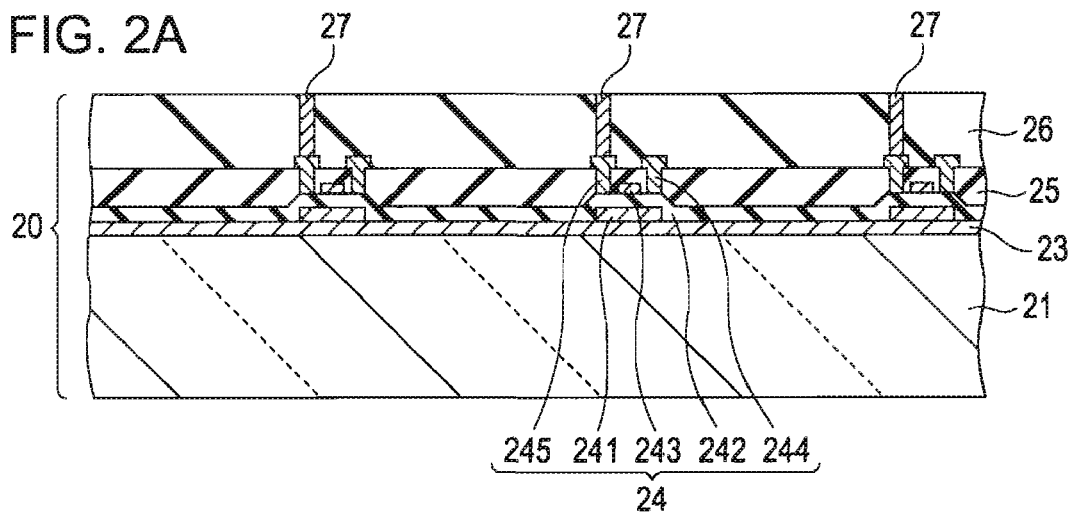
FIGS. 2A to 2D each illustrate a process for producing the active-matrix display shown in FIG. 1.

[1] The TFT circuit board 20 as shown in FIG. 2A is prepared.

[1-A] The substrate 21 is prepared. The underlying protective layer 23 is formed by plasma-enhanced CVD or the like with gas sources, such as tetraethoxysilane (TEOS) and an oxygen gas, the underlying protective layer 23 being mainly composed of silicon oxide and having an average thickness of about 200 to about 500 nm.

[1-B] The driving TFTs 24 are formed on the underlying protective layer 23.

[1-Ba] A semiconductor film is formed by plasma-enhanced CVD or the like on the underlying protective layer 23 while the substrate 21 is heated at about 350° C., the semiconductor film being mainly composed of amorphous silicon and having an average thickness of about 30 to about 70 mm.

[1-Bb] The resulting semiconductor film is subjected to crystallization treatment by laser annealing, solid phase epitaxy, or the like to convert amorphous silicon into polysilicon.

In laser annealing, for example, an excimer laser line beam having a length of 400 mm is used. For example, the output power is set at about 200 mJ/cm$^2$.

With respect to the line beam, the semiconductor film is scanned with the line beam in such a manner that a scan region scanned with a portion of the line beam overlaps adjacent scan region, the portion having an intensity of 90% of the peak laser intensity in the width direction.

[1-Bc] The semiconductor film is patterned into islands. The gate insulating layer 242 is formed by plasma-enhanced CVD or the like with gas sources, such as TEOS and an oxygen gas, so as to cover the semiconductor layer 241 in the form of islands, the gate insulating layer 242 being mainly composed of silicon oxide, silicon nitride, or the like and having an average thickness of about 60 to about 150 nm.

[1-Bd] A conductive film mainly composed of a metal, such as aluminum, tantalum, molybdenum, titanium, or tungsten, is formed by sputtering or the like on the gate insulating layer. The resulting conductive film is patterned to form the gate electrodes 243.

[1-Be] Highly-doped self-aligned source/drain regions are formed by implantation of phosphorus ions. Impurity-free portions serve as channel regions.

[1-C] The source electrodes 244 and the drain electrodes 245 electrically connected to the driving TFTs 24 are formed.

[1-Ca] The first insulating interlayer 25 is formed so as to cover the gate electrodes 243. Then, contact holes are formed.

[1-Cb] The source electrodes 244 and the drain electrodes 245 are formed in the contact holes.

[1-D] The leads (junction electrodes) 27 for electrical connection of the drain electrodes 245 and the anodes 3 are formed.

[1-Da] The second insulating interlayer 26 is formed on the first insulating interlayer 25. Then, contact holes are formed.

[1-Db] The leads 27 are formed in the contact holes.

In this way, the TFT circuit board 20 is formed.

[2] The organic EL elements 11, 12, and 13 are formed on the TFT circuit board 20.

Figure 2B:
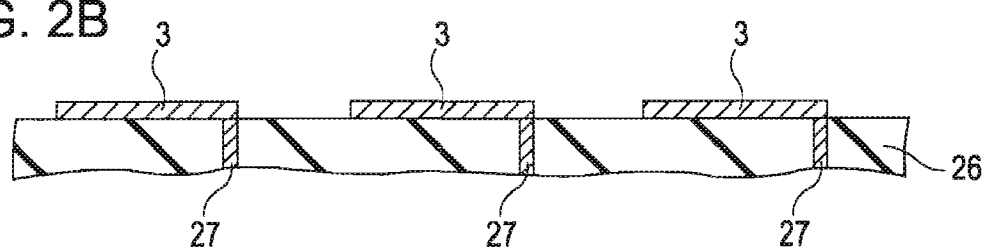

[2-A] As shove in FIG. 2B, the anodes (pixel electrodes) 3 are formed on the second insulating interlayer 26 disposed on the TFT circuit board 20.

The anodes 3 may be formed by, for example, a gas-phase process, such as sputtering, vacuum evaporation, or CVD; a liquid-phase process, such as spin coating (pyrosol process), casting, microgravure coating, gravure coating, bar coating, roll coating, wire-bar coating, dip coating, spray coating, screen printing, flexographic printing, offset printing, or inkjet printing.

The method is selected in view of physical properties and/or chemical properties, such as thermal stability of the material constituting each anode 3 and/or solubility in a solvent.

[2-B] The banks 35 are formed on the second insulating interlayer 26 so as to partition the anodes 3 (bank-forming step). As a result, recessed emission regions 361, 362, and 363 for forming three emissive layers 51, 52, and 53, respectively, are formed in regions surrounded by the anodes 3 and banks 35. Thus, mixing of evaporation materials in steps described below is prevented to permit each of the emissive layers 51, 52, and 53 to emit light at the level of the intrinsic light-emitting performance of the corresponding material.

Figure 2C:
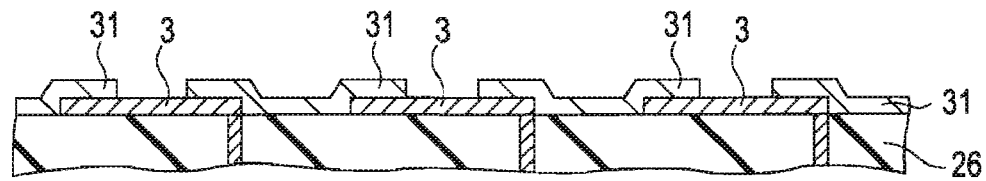
Figure 2D:
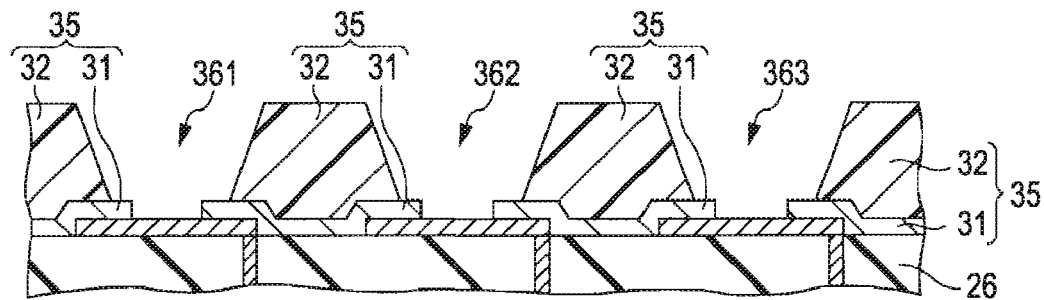

As shown in FIG. 2C, after the formation of the first bank portions 31 on the second insulating interlayer 26, the second bank portions 32 are formed on the first bank portions 31 as shown in FIG. 2D to form the banks 35.

An illustrating film is formed so as to cover the anodes 3 and the second insulating interlayer 26. The resulting insulating film is patterned by photolithography or the like to form the first bank portions 31. The second bank portions 32 may be formed by forming an insulating film over the anodes 3 and the first bank portions 31 and then performing the same procedure as in the formation of the first bank portions 31.

The materials constituting the first bank portions 31 and the second bank portions 32 are selected in view of thermostability, lyophobic properties, resistance to an ink solvent, and adhesion to the underlying layer.

Any of shapes of the openings surrounded by the banks 35 may be used. Each of the opening is in the form of a circle, an ellipse, a polygon, such as a rectangle or a hexagon.

The height of each first bank portion 31 is appropriately designed in response to the total thickness of each anode 3, the corresponding hole transport layer 4, and the corresponding emissive layer 5. The height of each first bank portion 31 is not particularly limited but is preferably about 30 to about 500 nm. The banks having the height sufficiently offer the function as the banks.

Figure 3E:
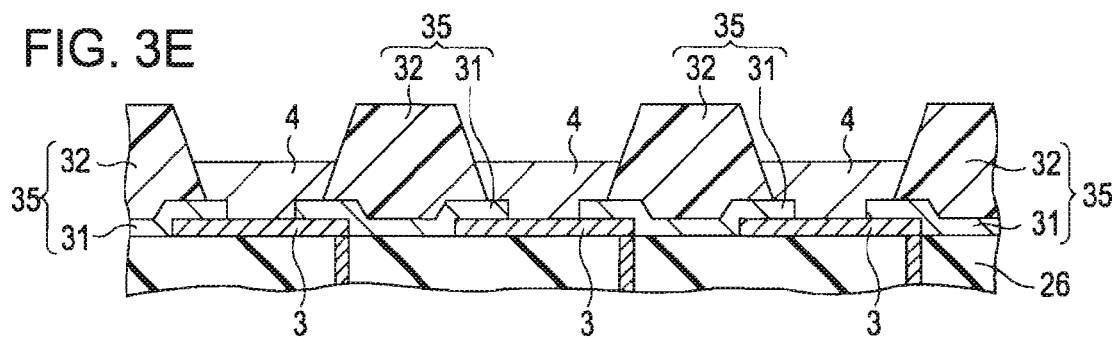
FIGS. 3E to 3H each illustrate a process for producing the active-matrix display shown in FIG. 1.

[2-C] As shown in FIG. 3E, the hole transport layers (semiconductor layers) 4 are formed on the anodes 3

The hole transport layers 4 may be formed by a gas-phase process or a liquid-phase process, in the same process as in the formation of the anodes 3.

[2-D] Each of the emissive layers (semiconductor layers) 5 is formed on a side of the hole transport layer 4 opposite the side adjacent to the corresponding anode 3.

As described above, the emissive layers 5 include three types of emissive layers: the first emissive layer 51 (blue), the second emissive layer 52 (red), and the third emissive layer 53 (white).

Each of the emissive layers 5 may be formed by a gas-phase process, such as evaporation, sputtering, or CVD. Each emissive layer 5 is preferably formed by evaporation (vacuum evaporation). Thus, the emissive layers 5 can be formed while maintaining the molecular structure of each material constituting the corresponding emissive layer 5. As a result, the materials can offer the intrinsic emission performance. Furthermore, the emissive layers 5 having satisfactory properties can be formed.

A process for forming the emissive layers 5 by evaporation will be described in detail below. In an evaporation process, evaporation is usually performed from an evaporation source disposed at the lower side to a workpiece disposed at the upper side. FIGS. 3F to 4I are upside down.

[2-Da] The TFT circuit board having the hole transport layers 4 is placed in an evaporation apparatus. The inside of the apparatus is evacuated.

Figure 3F:
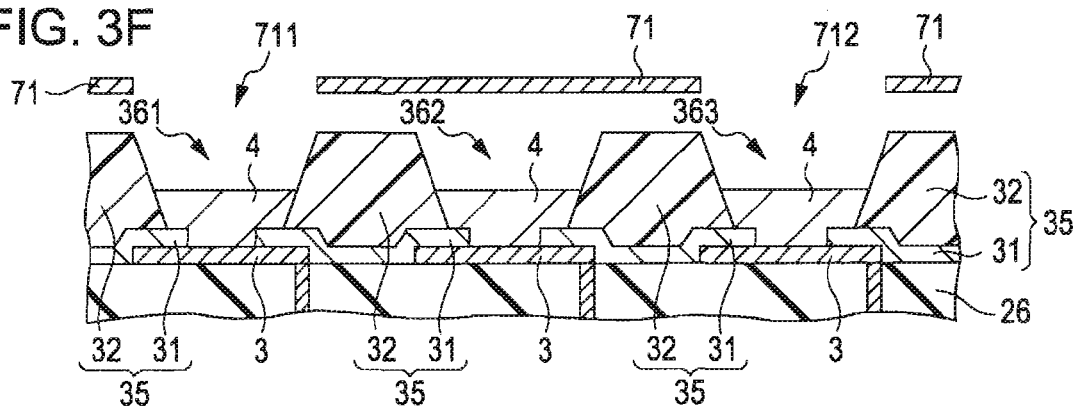

As shown in FIG. 3F, a first mask 71 is placed at a side of each bank 35 opposite the side adjacent to the second insulating interlayer 26.

The first mask 71 includes a predetermined opening (opening for forming the first emissive layer) 711 for selectively depositing the material constituting the first emissive layer 51 in the emission region 361 where the first emissive layer 51 will be formed; and a predetermined opening (opening for forming the third emissive layer) 712 for selectively depositing the material constituting the first emissive layer 51 in the emission region 363 where the third emissive layer 53 will be formed.

Figure 3G:
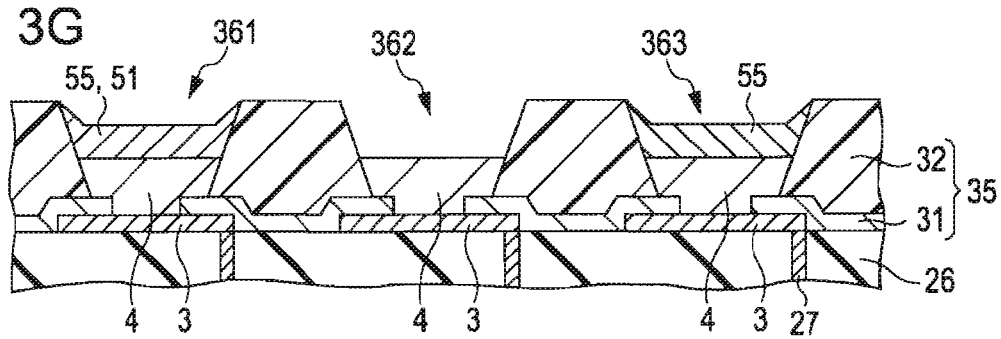

The material constituting the first emissive layer 51 is deposited (fed) from a side of the first mask 71 opposite the side adjacent to the banks 35 through the openings 711 and 712. As shown in FIG. 3G, films 55 are formed on a face of each hole transport layer 4 opposite the side adjacent to the corresponding anode 3 in the emission region 361 and a face of each hole transport layer 4 opposite the side adjacent to the corresponding anode 3 in the emission region 363. Among the films 55, the film 55 formed in the emission region 361 constitutes the first emissive layer 51 (first step).

The thickness of each film 55 affects color purities of emission colors of the first and third emissive layers 51 and 53 and is thus determined in view of the effect. For example, the thickness of each film 55 is preferably determined in view of the emission colors of the first and third emissive layers 51 and 53. As a result, it is possible to bring both color purities of the emission colors of the first and third emissive layers 51 and 53 closer to target color purities.

Figure 3H:
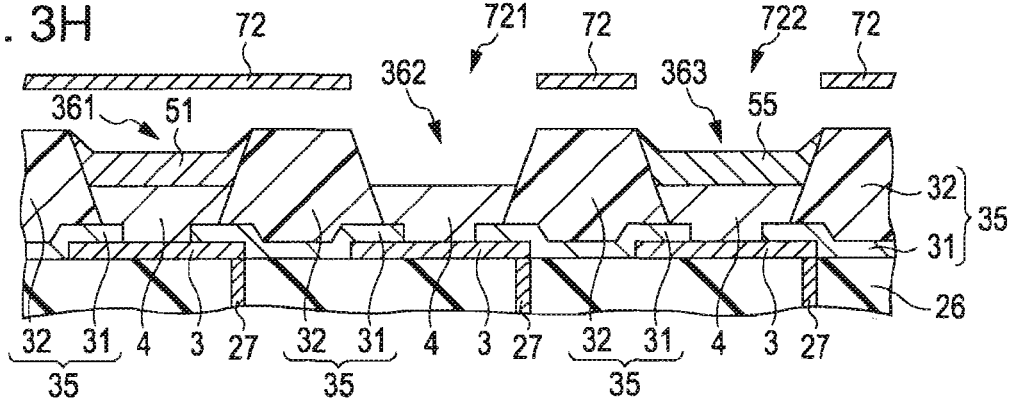

[2-Db] As shown in FIG. 3H, a second mask 72 is placed at a side of each bank 35 opposite the side adjacent to the second insulating interlayer 26.

The second mask 72 includes a predetermined opening (opening for forming the second emissive layer) 721 for selectively depositing the material constituting the second emissive layer 52 in the emission region 362 where the second emissive layer 52 will be formed; and a predetermined opening (opening for forming the third emissive layer) 722 for selectively depositing the material constituting the second emissive layer 52 in the emission region 363 where the third emissive layer 53 will be formed. When the second mask 72 is placed, the second mask 72 is positioned in such a manner that the position of the opening 722 is substantially identical to the position of the film 55 formed in the emission region 363.

Figure 4I:
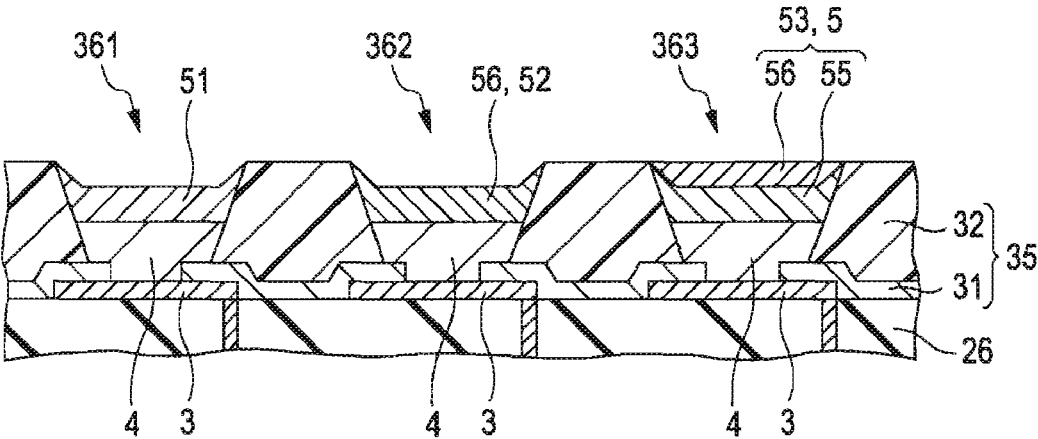
FIGS. 4I to 4K each illustrate a process for producing the active-matrix display shown in FIG. 1.

The material constituting the second emissive layer 52 is deposited (fed) from a side of the second mask 72 opposite the side adjacent to the banks 35 through the openings 721 and 722. As shown in FIG. 4I, films 56 are formed on a face of each hole transport layer 4 opposite the side adjacent to the corresponding anode 3 in the emission region 362 and a face of the film 55 opposite the side adjacent to the corresponding anode 3 in the emission region 363. Among the films 56, the film 56 formed in the emission region 362 constitutes the second emissive layer 52. The third emissive layer 53 including the films 55 and 56 is formed in the emission region 363, the films 55 and 56 being stacked (second step).

Similarly to the above-described films 55, the thickness of each film 56 is preferably determined in view of the emission colors of the second and third emissive layers 52 and 53. As a result, it is possible to bring both color purities of the emission colors of the second and third emissive layers 52 and 53 closer to target color purities.

in this embodiment, the first emissive layer 51 and the films 55 are formed in the same step. The second emissive layer 52 and the films 56 are formed in the same step.

Average thickness the process, the three types of the first emissive layers 51, 52, and 53 can be formed by two evaporations steps with two masks 71 and 72.

When the three types of emissive layers are formed according to the known art, the emissive layers 51 and 52 are commonly formed in a different step from a step of forming the emissive layer 53.

That is, in the known art, the first emissive layer 51 and the second emissive layer 52 are formed with the first masks 71 and 72.

Next, the films 55 and 56 are successively formed by evaporation in the emission region 363 through a mask having an opening for forming the third emissive layer.

In such a process, to form the three emissive layers 51, 52, and 53, at least three masks and at least four evaporation steps are required.

However, in view of economics, it is intended to minimize the number of the masks used because the masks are significantly expensive.

The evaporation steps are performed in reduced pressure for a prolonged period of time, thus prolonging the production process of the organic EL element. The percent defective during evaporation increases in proportion to the number of evaporation steps. Thus, it is necessary to minimize the number of the evaporation steps to shorten the process and improve the yield.

In contrast, in this embodiment, the three types of the first emissive layers 51, 52, and 53 can be formed through two evaporation steps with only two masks thereby producing the display 10 at low production costs, shortening the production process, and improving the yield.

Figure 4J:
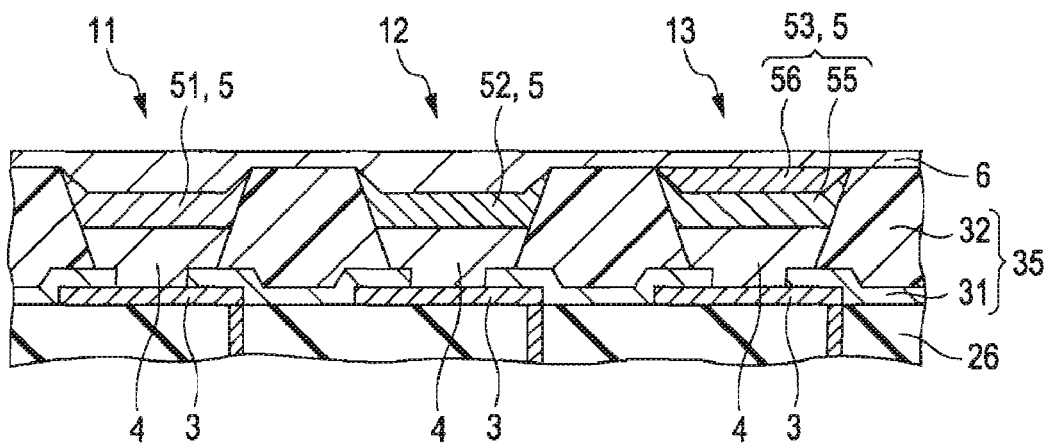

[2-E] As shown in FIG. 4J, a common cathode 6 is formed on the emissive layers 5 and the banks 35, i.e., the common cathode 6 is formed so as to cover the emissive layers 5 and the banks 35 (third step).

The cathode 6 can be formed in the same way as the gate electrode 243, for example.

In this embodiment, since the cathode 6 is formed on the entire surfaces of the emissive layers 5 and the banks 35, none of the masks is required. Thus, a gas-phase process or the like, such as evaporation, is preferably employed.

As described above, the organic EL elements 11, 12, and 13 can be formed.

Figure 4K:
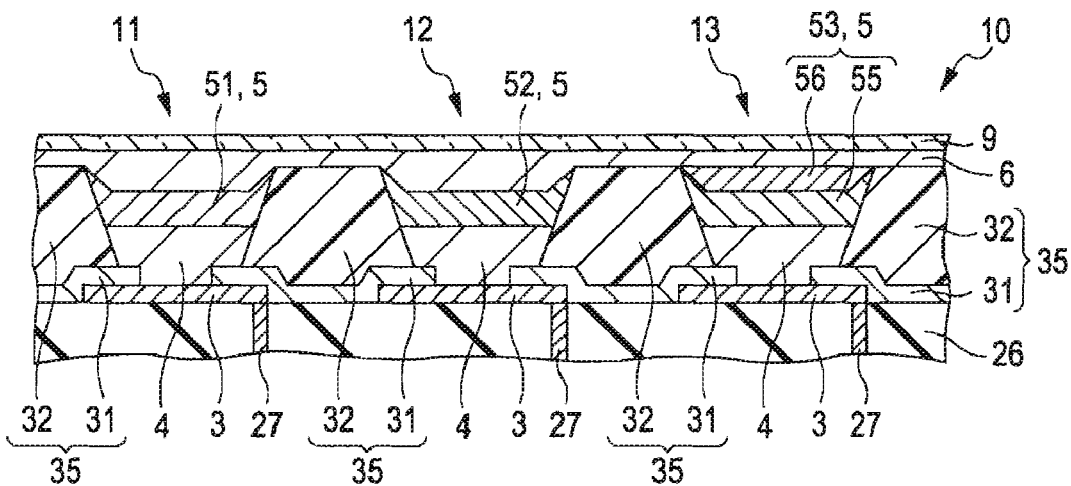

[3] Next, the top substrate 9 is prepared. As shown in FIG. 4K, the top substrate 9 is bonded to the cathode 6 so as to cover the cathode 6 with the top substrate 9.

Bonding between the cathode 6 and the top substrate 9 can be performed by, for example, applying an epoxy adhesive to the interface between the cathode 6 and the top substrate 9 and then drying the adhesive.

The top substrate 9 serves as a protective substrate for the organic EL elements 11, 12, and 13. Disposing the top substrate 9 on the cathode 6 can prevent or reduce the contact of the organic EL elements 11, 12, and 13 to oxygen and water, thereby improving reliability of the organic EL elements 11, 12, and 13 and preventing degradation and alteration.

The display 10 can be produced through the steps described above.

Second Embodiment

Next, a second embodiment of an active-matrix display including an emissive device according to an aspect of the invention and a second embodiment of a process for producing the active-matrix display will be described.

Figure 5:
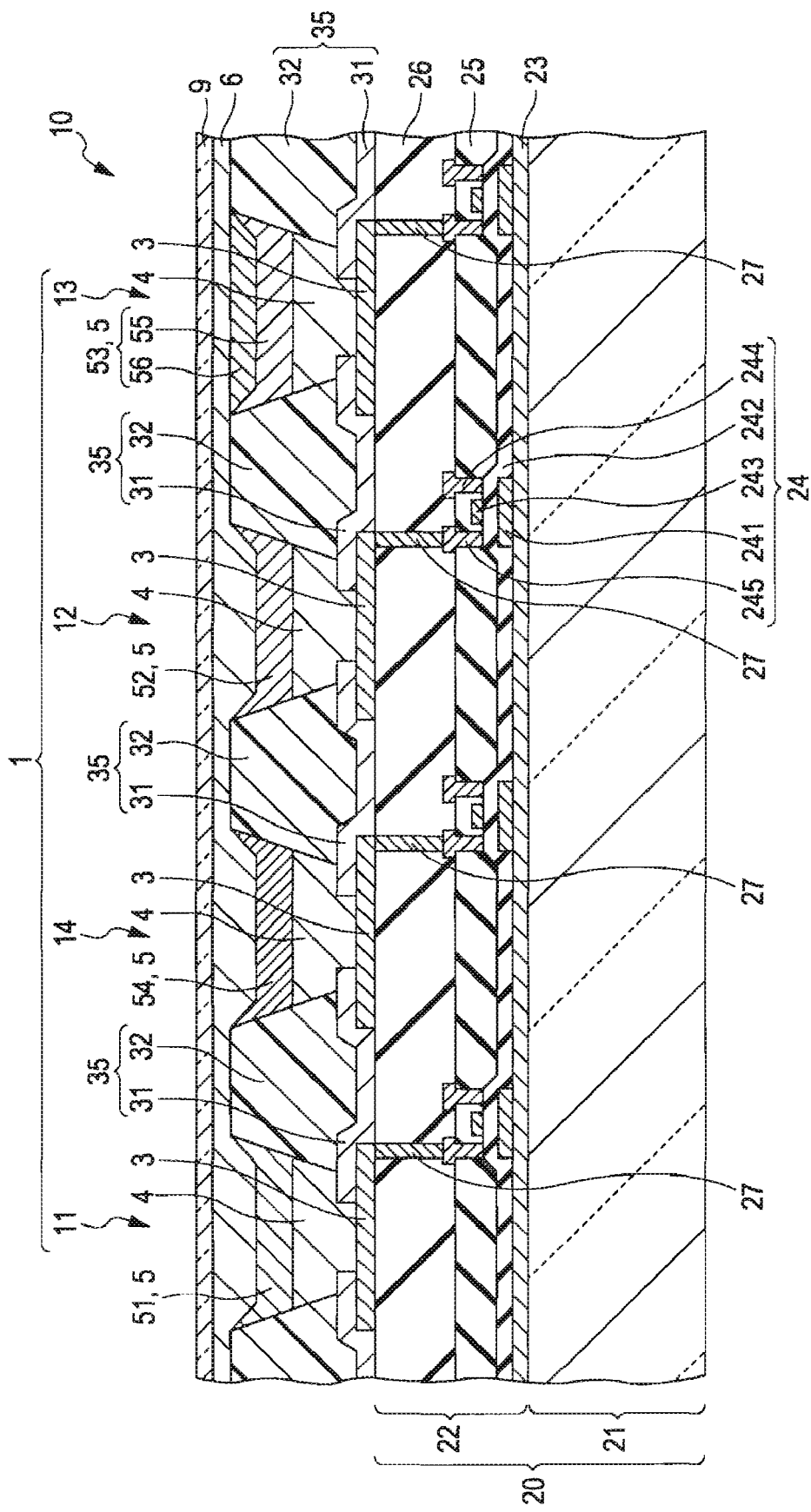
FIG. 5 is a longitudinal sectional view of an active-matrix display according to a second embodiment including an emissive device according to an aspect of the invention.

FIG. 5 is a longitudinal sectional view of an active-matrix display according to a second embodiment including an emissive device according to an aspect of the invention. In the following description, the upper side of FIG. 5 refers to an "upper side", and the lower side of FIG. 5 refers to a "lower side".

The second embodiment will be described below. The differences between the first embodiment and the second embodiment will be mainly described. The redundant description on the same item is not repeated.

The display 10 is the same structure as that in the first embodiment, except for the structure of the pixel 1.

In this embodiment, as shown in FIG. 5, the display 10 includes four types of organic EL elements 11, 12, 13, and 14. The organic EL elements 11, 12, 13, and 14 constitute a single pixel 1. That is the pixel 1 in this embodiment includes the fourth organic EL element 14 in addition to the pixel 1 of the first embodiment including the first organic EL element 11, the second organic EL element 12, and the third organic EL element 13.

The four types of the organic EL elements 11, 12, 13, and 14 emit different colors from each other. The emission colors are not particularly limited. In this embodiment, each of the first organic EL elements 11 emits blue (first color) light, each of the second organic EL elements 12 emits red (second color) light, each of the third organic EL elements 13 emits white (third color) light, and each of the fourth organic EL elements 14 emits green (fourth color) light. The adjustment of emission intensity of the four organic EL elements 11, 12, 13, and 14 permits each pixel 1 to emit light in full color.

Each fourth organic EL element 14 includes a fourth emissive layer 54. The fourth emissive layer 54 is composed of a material that emits green (fourth color) light.

When the display 10 is produced, a step [2-Dc] of forming the fourth emissive layer 54 is added after the step [2-Db] of the first embodiment. In the step, a third mask and an evaporation step are required to form the fourth emissive layer 54 by evaporation.

Thus, in this embodiment, it is possible to efficiently form the four types of the emissive layers 51, 52, 53, and 54 through a small number of evaporation steps (three times) with a small number of masks (three), thereby producing the display 10 at low production costs, shortening the production process, and improving the yield.

The third mask includes a predetermined opening (opening for forming the fourth emissive layer) for selectively depositing the material constituting the fourth emissive layer 54 in an emission region where the fourth emissive layer 54 will be formed.

Third Embodiment

Next, a third embodiment of an active-matrix display including an emissive device according to an aspect of the invention and a third embodiment of a process for producing the active-matrix display will be described.

Figure 6:
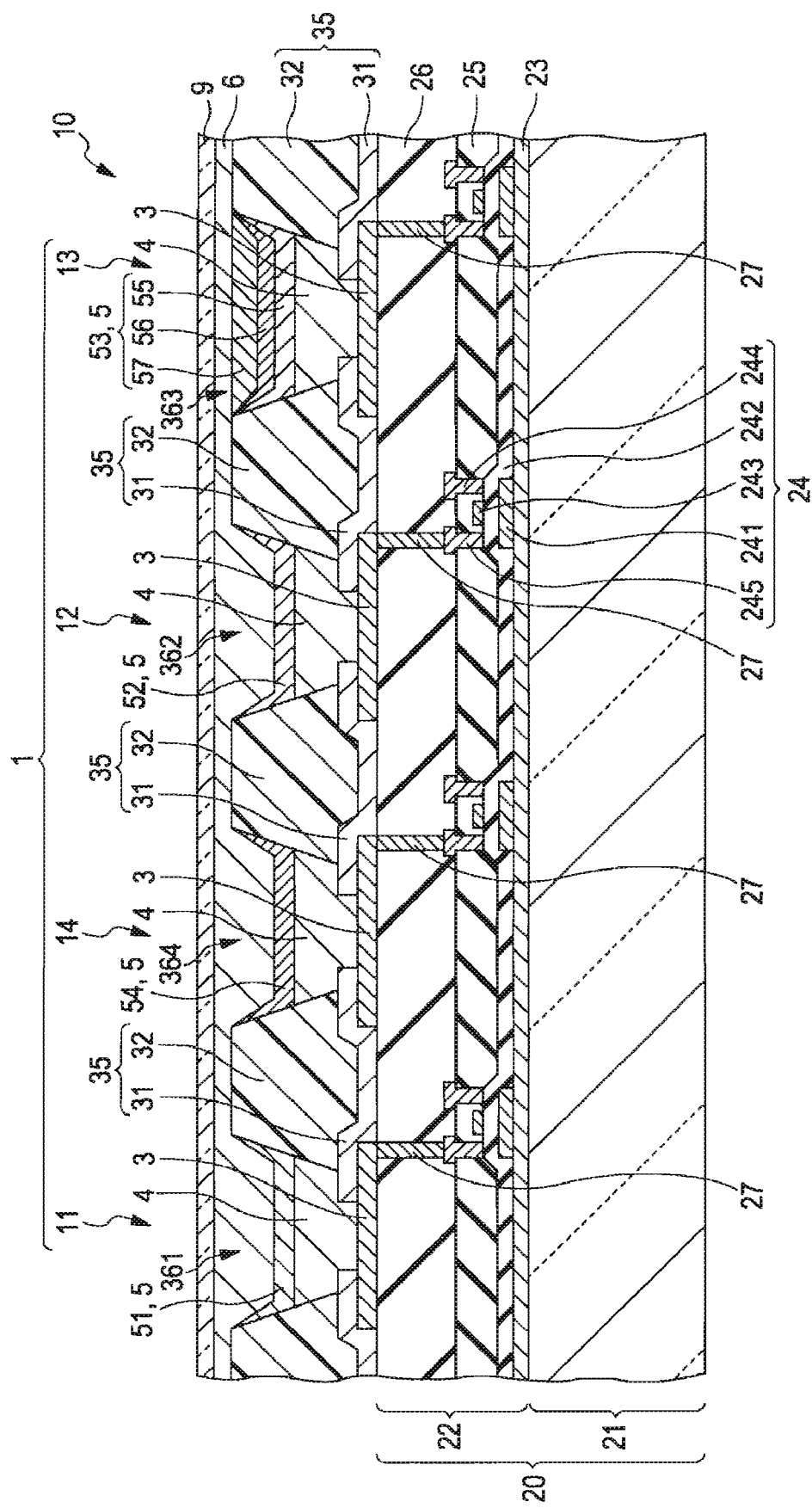
FIG. 6 is a longitudinal sectional view of an active-matrix display according to a third embodiment including an emissive device according to an aspect of the invention.

FIG. 6 is a longitudinal sectional view of an active-matrix display according to a third embodiment including an emissive device according to an aspect of the invention. In the following description, the upper side of FIG. 6 refers to an "upper side", and the lower side of FIG. 6 refers to a "lower side".

The third embodiment will be described below. The differences between the first and second embodiments and the third embodiment will be mainly described. The redundant description on the same item is not repeated.

The display 10 is the same structure as that in the second embodiment, except for the structure of the third emissive layer.

That is, in the first and second embodiments, the third emissive layer 53 has a two-layer structure in which the film 55 composed of the material constituting the first emissive layer 51 and the film 56 composed of the material constituting the second emissive layer 52 are stacked. In the third embodiment, the third emissive layer 53 has a three-layer structure in which the film 55, the film 56, and a film 57 composed of a material constituting the fourth emissive layer 54 are stacked. According to the structure, the emissive layer (third emissive layer 53) that emits white light having higher whiteness level can be formed through a small number of evaporation steps (at least three steps). Thus, each pixel 1 has more satisfactory color rendering properties and can emit light in full color.

In the case, the third mask used when the fourth emissive layer 54 is deposited includes an opening for forming the fourth emissive layer; and a predetermined opening (opening for forming the fourth emissive layer 54) for depositing the material constituting the fourth emissive layer 54 in an emission region where the third emissive layer 53 will be formed.

In the step [2-Dc] of forming the fourth emissive layer 54, when the third mask is placed, the mask is positioned in such a manner that the position of the opening for forming the third emissive layer is substantially identical to the position of the film 56 formed in the step [2-Db].

The material constituting the fourth emissive layer 54 is deposited (fed) from a side of the third mask opposite the side adjacent to the banks 35 through the openings for forming the third and fourth emissive layers. The films 57 are formed on a face of each hole transport layer 4 opposite the side adjacent to the corresponding anode 3 in the emission region 364 where the fourth emissive layer 54 will be formed and a face of the film 56 opposite the side adjacent to the corresponding anode 3 in the emission region 363. Among the films 57, the film 57 formed in the emission region 364 constitutes the fourth emissive layer 54. The third emissive layer 53 including the films 55, 56, and 57 in the emission region 363, the films 55, 56, and 57 being stacked.

Also in the embodiment described above, the same operation and effect as in the first and second embodiments are obtained.

Electronic Apparatus

The display (emissive device according to an aspect of the invention) 10 can be incorporated in any of various electronic apparatuses.

Figure 7:
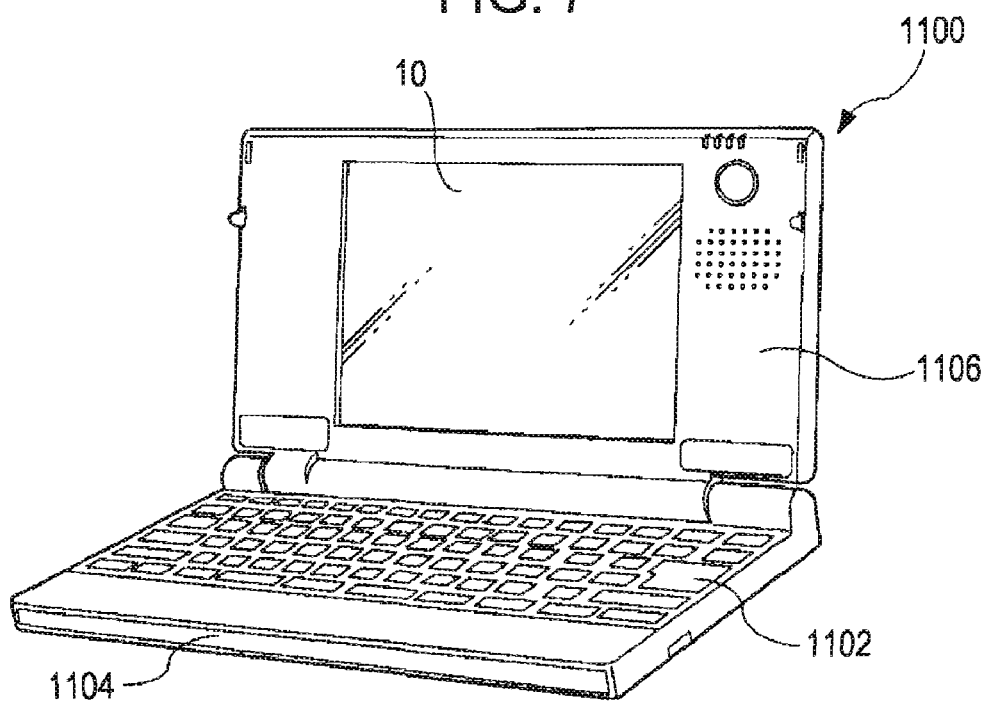
FIG. 7 is a perspective view of a mobile or laptop personal computer including an electronic apparatus according to an aspect of the invention.

FIG. 7 is a perspective view of a mobile or laptop personal computer including an electronic apparatus according to an aspect of the invention.

In the figure, a personal computer 1100 includes a main body 1104 having a keyboard 1102 and a display unit 1106 having a display portion, the display unit 1106 being rotatably supported by the main body 1104 with a hinge mechanism.

In the personal computer 1100, the display portion of the display unit 1106 includes the display 10.

Figure 8:
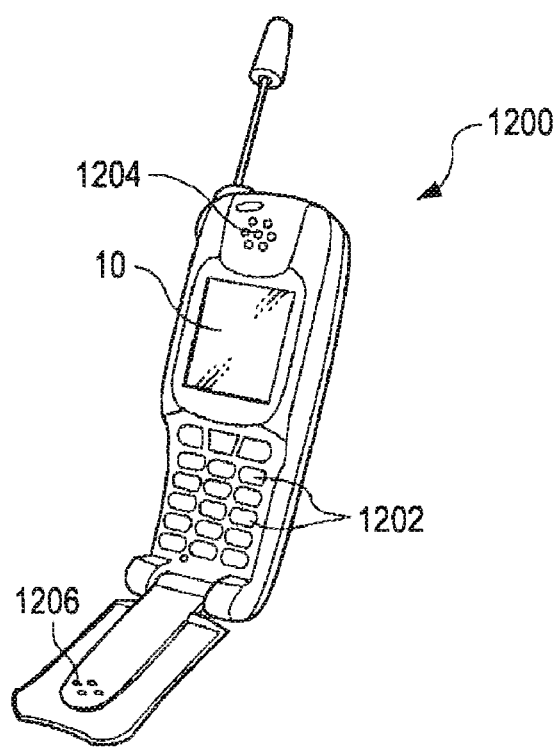
FIG. 8 is a perspective view of a cellular phone (including PHS) including an electronic apparatus according to an aspect of the invention.

FIG. 8 is a perspective view of a cellular phone (including PHS) including an electronic apparatus according to an aspect of the invention.

In the figure, a cellular phone 1200 includes a plurality of operation buttons 1202, an ear piece 1204, and a mouth piece 1206, and a display portion.

In the cellular phone 1200, the display portion includes the display 10.

Figure 9:
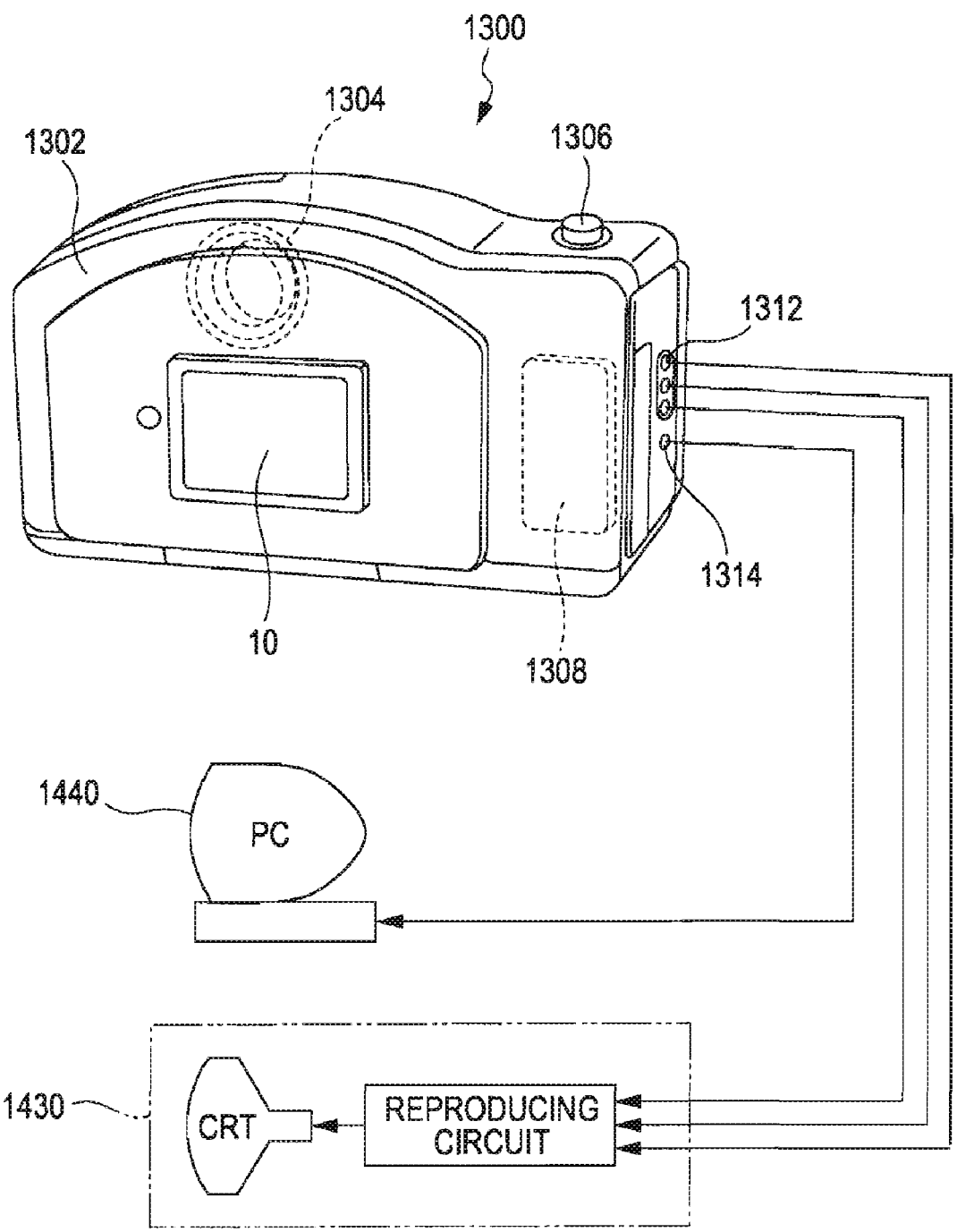
FIG. 9 is a perspective view of a digital still camera including an electronic apparatus according to an aspect of the invention.

FIG. 9 is a perspective view of a digital still camera including an electronic apparatus according to an aspect of the invention. The figure also schematically show interfacing to external devices.

A usual camera exposes a silver-salt photographic film to the optical image of a subject. A digital still camera 1300 photoelectrically converts the optical image of a subject into image signals (picture signals) with an imaging device such as a charge-coupled device (CCD).

A display portion is disposed at the back of the case (body) 1302 of the digital still camera 1300. The display is performed on the basis of image signals from the CCD. The display portion functions as a viewfinder for displaying a subject as an electronic image.

In the digital still camera 1300, the display portion includes the display 10.

The case includes a circuit board 1308 therein. The circuit board 1308 includes a memory capable of storing image signals.

A light receiving unit 1304 including an optical lens (imaging optical system) and the CCD is disposed at the front side of the case 1302 (back side in the figure).

When a photographer identifies a subject image displayed on the display portion and presses a shutter button 1306, image signals from the CCD at the point are transferred and stored in the memory.

In the digital still camera 1300, a video-signal output terminal 1312 and an input-output terminal 1314 for data communication are disposed at the side face of the case 1302. As shown in the figure, the video-signal output terminal 1312 is optionally connected to a television monitor 1430. The input-output terminal 1314 for data communication is optionally connected to a personal computer 1440. Furthermore, the image signals stored in the memory of the circuit board 1308 is fed to the television monitor 1430 and personal computer 1440 by a predetermined operation.

The electronic apparatus according to an aspect of the invention can be used for, for example, television sets, video cameras, viewfinder-type videotape recorders, direct-view-type videotape recorders, laptop personal computers, car navigation systems, pagers, personal digital assistants (including personal digital assistants supporting communication functions), electronic dictionaries, electronic calculators, computerized game machines, word processors, workstations, video phones, TV monitors for the prevention of crime, electronic binoculars, POS terminals, apparatuses provided with touch-sensitive panels (for example, cash dispensers of financial institutions and automatic ticket vending machines), medical devices (for example, electronic thermometers, sphygmomanometers, blood glucose monitors, electrocardiogram displays, ultrasonic diagnostic equipment, and displays for endoscopes), fish detectors, various measuring devices, meters (for example, meters for vehicles, aircraft, and ships), flight simulators, other monitors, and projection displays such as projectors in addition to the personal computer shown in FIG. 7, the cellular phone shown in FIG. 8, and the digital still camera shown in FIG. 9. The electronic apparatus according to an aspect of the invention may have a light-emitting function, for example, a light source. The electronic apparatus is not limited to an apparatus having a display function.

According to an aspect of the invention, the emissive device, the process for producing the emissive device, and the electronic apparatus have been described on the basis of the embodiments shown in the figures. However, the present invention is not limited thereto.

For example, the process according to an aspect of the invention for producing the emissive device may further include at least one intended step.

What is claimed is:

1. A process for producing an emissive device including:
   a first region where a first emissive layer is formed, the first emissive layer composed of a first material that emits light of a first color,
   a second region where a second emissive layer is formed, the second emissive layer composed of a second material that emits light of a second color different from the first color, and
   a third region where a third emissive layer is formed, the third emissive layer that emits light of a third color by stacking the first material and the second material, the third color being different from both of the first color and the second color,
   a fourth emissive layer composed of a material that emits light of a fourth color different from the first color, the second color, and the third color, the process comprising:

(1) feeding the first material to the first region and the third region and to a side adjacent to a first face of at least one first electrode by a gas-phase process with a first mask to form films, the first mask having an opening for forming the first emissive layer and having an opening for forming the third emissive layer;
   (2) feeding the second material to the second region and the third region such that the second material fed in the third region is stacked above the first material in the third region and to the side adjacent to the first face of each first electrode by a gas-phase process to form the emissive layers while a second mask having an opening for forming the second emissive layer and having an opening for forming the third emissive layer is positioned in such a manner that the position of each film to be the third emissive layer is substantially identical to the position of the opening for forming the third emissive layer;
   (3) forming a second electrode at a side of each emissive layer opposite the side adjacent to the first electrode; and
   (4) feeding the material that emits light of the fourth color to the side adjacent to the first face of each first electrode by a gas-phase process with a third mask having an opening for forming the fourth emissive layer.

2. The process for producing the emissive device according to claim 1, wherein one of the first color and the second color is blue, the other is red, and the third color is white.

3. The process for producing the emissive device according to claim 1, the emissive device including the third emissive layer that emits light of the third color by stacking the first material, the second material, and the material that emits light of the fourth color, the process comprising:
   the step (4) being performed between the step (1) and the step (2),
   wherein the step (4) includes feeding the material that emits light of the fourth color to the side adjacent to the first face of the at least one first electrode by a gas-phase process while the third mask having the opening for forming the fourth emissive layer and further having an opening for forming the third emissive layer is positioned in such a manner that the position of each film to be the third emissive layer is substantially identical to the position of the opening for forming the third emissive layer.

4. The process for producing the emissive device according to claim 1, the fourth color is green.

5. The process for producing the emissive device according to claim 1, the emissive device having a structure in which light emerges from the first electrode side,
   wherein the first color is blue, and the second color is red.

6. The process for producing the emissive device according to claim 1, wherein each of the first electrodes is disposed in a corresponding one of the emissive layers, and
   the process further comprises forming banks for partitioning each first electrode before the step (1).

7. The process for producing the emissive device according to claim 1, wherein the gas-phase process is an evaporation process.

8. An emissive device produced by the process for producing the emissive device according to claim 1.

9. An electronic apparatus including the emissive device according to claim 8.

* * * * *